(12) United States Patent
Funaki

(10) Patent No.: US 12,009,354 B2
(45) Date of Patent: Jun. 11, 2024

(54) SSD WAFER DEVICE AND METHOD OF MANUFACTURING SAME

(71) Applicant: WESTERN DIGITAL TECHNOLOGIES, INC., San Jose, CA (US)

(72) Inventor: Ken Funaki, Tokyo (JP)

(73) Assignee: Western Digital Technologies, Inc., San Jose, CA (US)

( * ) Notice: Subject to any disclaimer, the term of this patent is extended or adjusted under 35 U.S.C. 154(b) by 125 days.

(21) Appl. No.: 17/547,455

(22) Filed: Dec. 10, 2021

(65) Prior Publication Data

US 2023/0187430 A1 Jun. 15, 2023

(51) Int. Cl.
| | | |
|---|---|---|
| *H01L 25/18* | (2023.01) | |
| *H01L 23/00* | (2006.01) | |
| *H01L 23/538* | (2006.01) | |
| *H01L 25/00* | (2006.01) | |
| *H01L 25/065* | (2023.01) | |

(52) U.S. Cl.
CPC .......... *H01L 25/18* (2013.01); *H01L 23/5386* (2013.01); *H01L 24/08* (2013.01); *H01L 25/0655* (2013.01); *H01L 25/50* (2013.01); *H01L 24/06* (2013.01); *H01L 24/94* (2013.01); *H01L 2224/06152* (2013.01); *H01L 2224/08145* (2013.01); *H01L 2924/10156* (2013.01); *H01L 2924/14511* (2013.01)

(58) Field of Classification Search
CPC ..... H01L 25/18; H01L 23/5386; H01L 24/08; H01L 25/0655; H01L 25/50; H01L 24/06; H01L 24/94; H01L 2224/08145; H01L 2924/10156; H01L 2924/14511; H01L 24/05; H01L 23/538; H01L 24/13
See application file for complete search history.

(56) References Cited

U.S. PATENT DOCUMENTS

| 2021/0296298 A1* | 9/2021 | Sanuki | H01L 25/50 |
| 2022/0059505 A1* | 2/2022 | Song | H01L 25/16 |
| 2022/0108926 A1* | 4/2022 | Pachamuthu | G01R 31/312 |

FOREIGN PATENT DOCUMENTS

| JP | 2019220680 A | 12/2019 |
| JP | 2021150601 A | 9/2021 |
| WO | 2021095469 A1 | 5/2021 |

\* cited by examiner

*Primary Examiner* — Thanh Y. Tran
(74) *Attorney, Agent, or Firm* — Vierra Magen Marcus LLP

(57) ABSTRACT

A solid state drive (SSD) wafer device includes first and second semiconductor wafers coupled together. The first wafer may include a number of memory dies with die bond pads, and the second wafer may include a number of electrical interconnects, each including first and second terminals at opposed ends of the electrical interconnect. When the wafers are bonded together, the first terminals of the second wafer are bonded to the die bond pads of the memory dies of the first wafer. The second terminals are left exposed to couple with an SSD controller, which controls the transfer of data and signals between the memory dies of the first wafer and a host device such as a server in a datacenter.

12 Claims, 14 Drawing Sheets

(CS-1)

(CS-2)

SSD WAFER DEVICE AND METHOD OF MANUFACTURING SAME

BACKGROUND

The need for large-scale data storage continues to grow, whether it be for portable consumer devices or in large, grid or cloud-based datacenters. Datacenters are transitioning from using traditional rotating disc drives to solid state drives (SSDs) including non-volatile NAND memory. While many varied SSD device configurations are known, examples may in general be assembled as system-in-a-package (SIP) or multichip modules (MCM), where a plurality of semiconductor dies are diced from a wafer and then mounted to an upper surface of a substrate together with a controller die. The devices may then be encapsulated in a mold compound. One or more of these devices may then be mounted to a host device such as a printed circuit board and used together as an SSD. While providing large storage capacities, such devices are labor and cost intensive, requiring numerous fabrication steps to form and dice the semiconductor dies, and then multiple assembly steps to form the dies into semiconductor packages.

DETAILED DESCRIPTION

Figure 1:
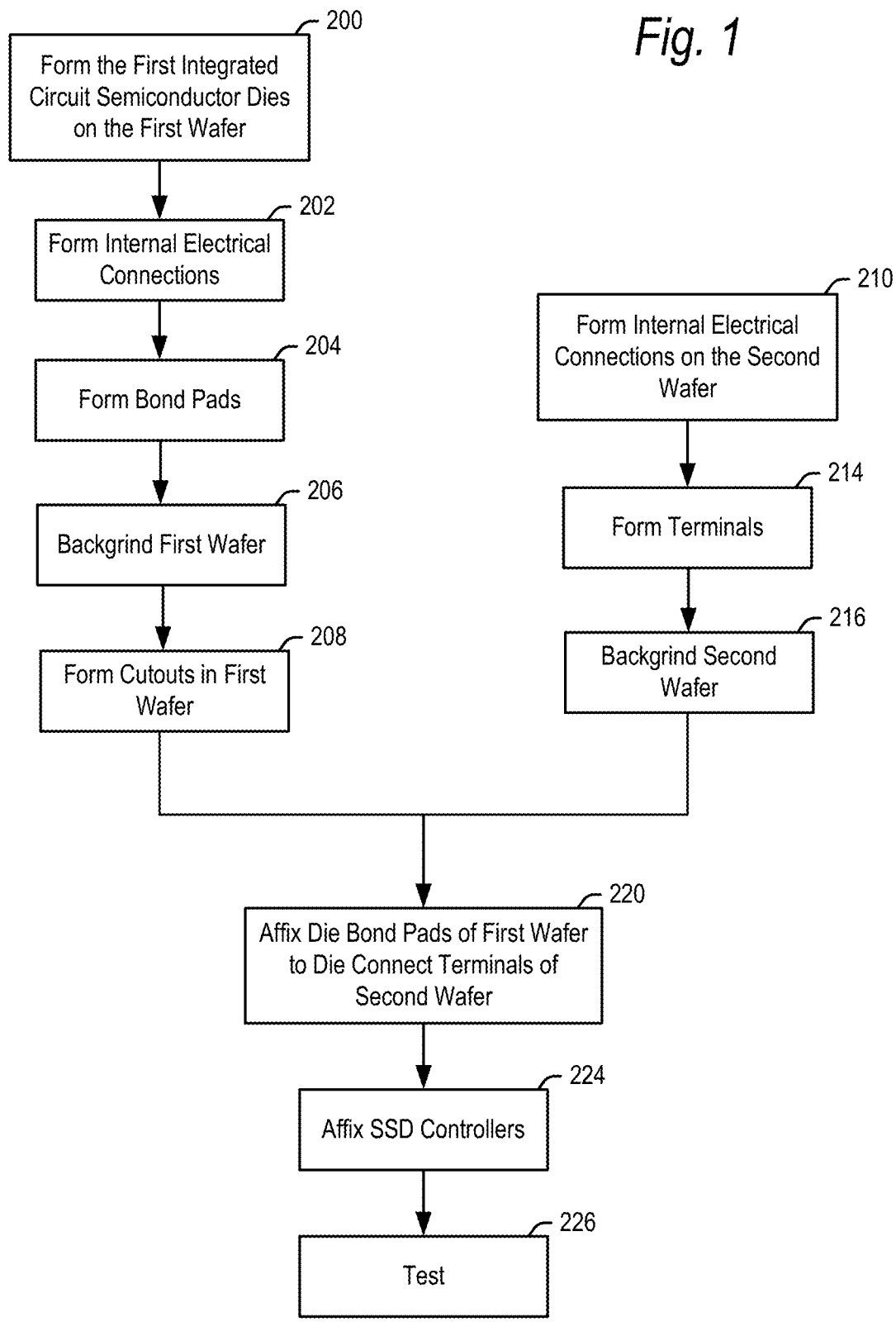
FIG. 1 is a flowchart for forming an SSD wafer device according to embodiments of the present technology.

The present technology will now be described with reference to the figures, which in embodiments, relate to SSD device formed of whole semiconductor wafers. A first wafer in the SSD device may be processed to include a number of semiconductor dies with die bond pads, which in embodiments, may be flash memory dies. The first wafer may be fabricated to include cutouts around a periphery of the wafer, in areas unused by semiconductor dies. A second wafer in the SSD wafer device may be processed to include electrical interconnects, each having first and second terminals on a major surface of the second wafer. The first terminals of the interconnects are mapped to positions which correspond to the positions of the die bond pads of the dies on the first wafer. The second terminals of the interconnects are mapped to positions which correspond to the positions of the cutouts on the first wafer.

Once processed, the first and second wafers may be joined to form the SSD wafer device. The wafers may for example be joined by bonding the first terminals of the electrical interconnects of the second wafer to the bond pads of the dies on the first wafer, as by copper-to-copper (Cu-to-Cu) bonding. The second terminals of the interconnects of the second wafer are left uncovered and accessible in the cutouts of the first wafer. Once the wafers are joined in this way, SSD controllers may be mounted at the cutouts and coupled to the second terminals of the electrical interconnects. Thereafter, the joined wafers may be used as an SSD device, with the SSD controllers controlling the transfer of data to/from each of the semiconductor dies of the first wafer in the SSD wafer device.

In a further embodiment, the cutouts of the first wafer may be omitted. In this embodiment, the electrical interconnects have first terminals on a first major surface of the second wafer at positions corresponding to the positions of the die bond pads of the dies on the first wafer. The second terminals of the electrical interconnects extend to a second major surface of the second wafer, opposite the first major surface. The second terminals of all electrical interconnects may group together in one or more clusters on the second major surface. The first and second wafers may then be bonded together with the terminals in the first major surface of the second wafer bonding to the die bond pads of the dies in the first wafer. Once the wafers are joined in this way, one or more SSD controllers may be affixed to the second terminals on the second major surface of the second wafer. Thereafter, the joined wafers may be used as an SSD device, with the one or more SSD controllers controlling the transfer of data to/from each of the semiconductor dies of the first wafer in the SSD wafer device.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 2:
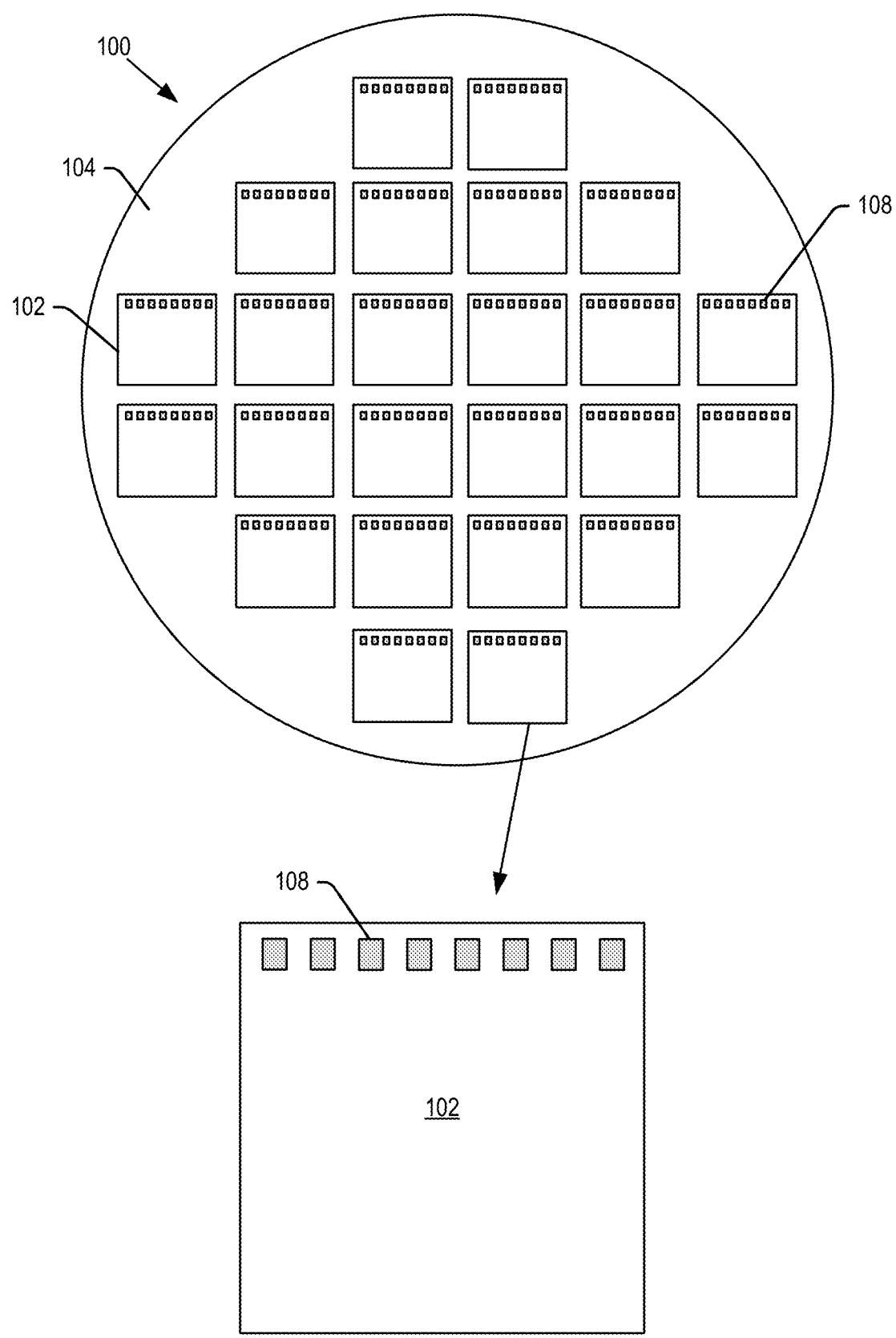
FIG. 2 is a plan view of a first semiconductor wafer, and a semiconductor die therefrom, according to embodiments of the present technology.
Figure 3:
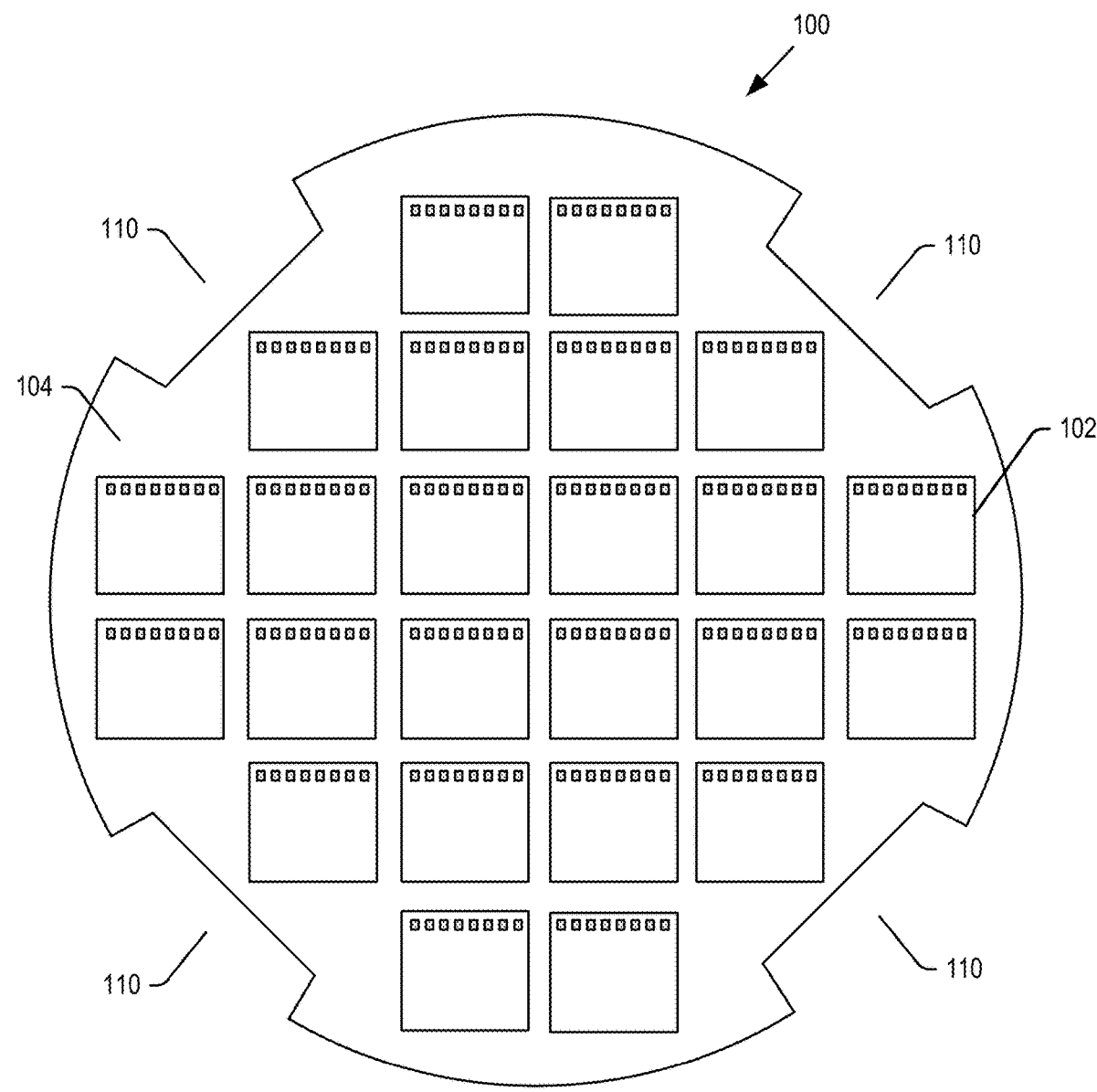
FIG. 3 is a plan view of a first semiconductor wafer after cutouts are formed according to embodiments of the present technology.

An embodiment of the present technology will now be explained with reference to the flowchart of FIG. 1, and the views of FIGS. 2-24. In step 200, a first semiconductor wafer 100 may be processed into a number of semiconductor dies 102 as shown in FIG. 2. The first semiconductor wafer 100 may start as an ingot of wafer material which may be monocrystalline silicon grown according to either a Czochralski (CZ) or floating zone (FZ) process. However, the first wafer 100 may be formed of other materials and by other processes in further embodiments.

The semiconductor wafer 100 may be cut from the ingot and polished on both the first major planar surface 104, and second major planar surface 106 (FIGS. 9 and 10) opposite surface 104, to provide smooth surfaces. The first major surface 104 may undergo various processing steps to divide the wafer 100 into the respective semiconductor dies 102, and to form integrated circuits of the respective semiconductor dies 102 in an active region on and/or in the first major surface 104.

In embodiments, the semiconductor dies 102 may be fabricated as flash memory dies, including for example 2D NAND flash memory or 3D BiCS (Bit Cost Scaling), V-NAND or other 3D flash memory, but other types of dies 110 may be used. In such embodiments, the active region of wafer 100 may be processed in step 200 to include integrated circuit memory cell arrays formed in a dielectric substrate. In step 204, various electrically conductive metallization layers may be patterned in the active region, including internal metallization layers (not shown) and die bond pads 108 on a surface of each of the semiconductor dies 102. The pattern and number of die bond pads 108 on dies 102 shown in FIG. 2 is by way of example only, and other patterns and numbers of die bond pads 108 may be formed on the surface of dies 102 in further embodiments. The memory cell arrays within the semiconductor dies 102 may be coupled to the die bond pads 108 by the internal metallization layers and electrically conductive vias (not shown) formed generally perpendicularly to the metallization layers.

The bond pads 108 may be formed for example of copper, aluminum and alloys thereof, and may include a liner on an uppermost surface formed for example of a titanium/titanium nitride stack such as for example Ti/TiN/Ti, though these materials may vary in further embodiments. The materials of the bond pads 108 may be applied by vapor deposition and/or plating techniques.

In step 206, the first semiconductor wafer 100 may be thinned in a backgrind process to its final thickness, which in embodiments may be between 20 µm and 50 µm, such as for example 25 µm, though the wafer 100 may be thinner or thicker than this range in further embodiments. FIG. 2 shows a pattern of semiconductor dies 102 on wafer 100, but the number and pattern of semiconductor dies 102 is shown for illustrative purposes, and the number and/or pattern of semiconductor dies 102 in wafer 100 may vary in further embodiments.

Regardless of the number and pattern of dies 102, given the geometry of the dies 102 and the circular nature of semiconductor wafer 100, there will be unused areas of wafer 100 where no dies are fabricated. In accordance with one embodiment of the present technology, the wafer 100 may be cut in these areas in step 208 to form cutouts 110 in wafer 100 as shown in the plan view of FIG. 3. The cutouts 110 may be generally rectangular and formed by saw, laser, chemical etching, though the cutouts 110 may be other shapes and formed by other methods for removing the wafer material in the area of the cutouts 110. In further embodiments, the cutouts 110 may be formed before the backgrind step 206.

The size of the cutouts 110 may vary in embodiments, depending for example on the number of cutouts and the number of die bond pads 108 on wafer 100, as explained below. In the embodiment shown, there are four cutouts 110, one each within four quadrants of wafer 100. It is conceivable that wafer 100 may include more or less than four cutouts 110 in further embodiments. As noted, the cutouts may advantageously be positioned in areas of wafer 100 unused for semiconductor die processing. However, in further embodiments, it is conceivable that one or more areas of wafer 100, such as for example a central area of wafer 100 otherwise used for semiconductor dies, may be designated as keep-out areas. The wafer map may be provided such that no semiconductor dies are formed in these keep-out areas, and the cutouts 110 be formed in these areas. Moreover, the cutouts 110 may be omitted entirely in an alternative embodiment of the present technology, described below with respect to FIGS. 16-23.

Figure 4:
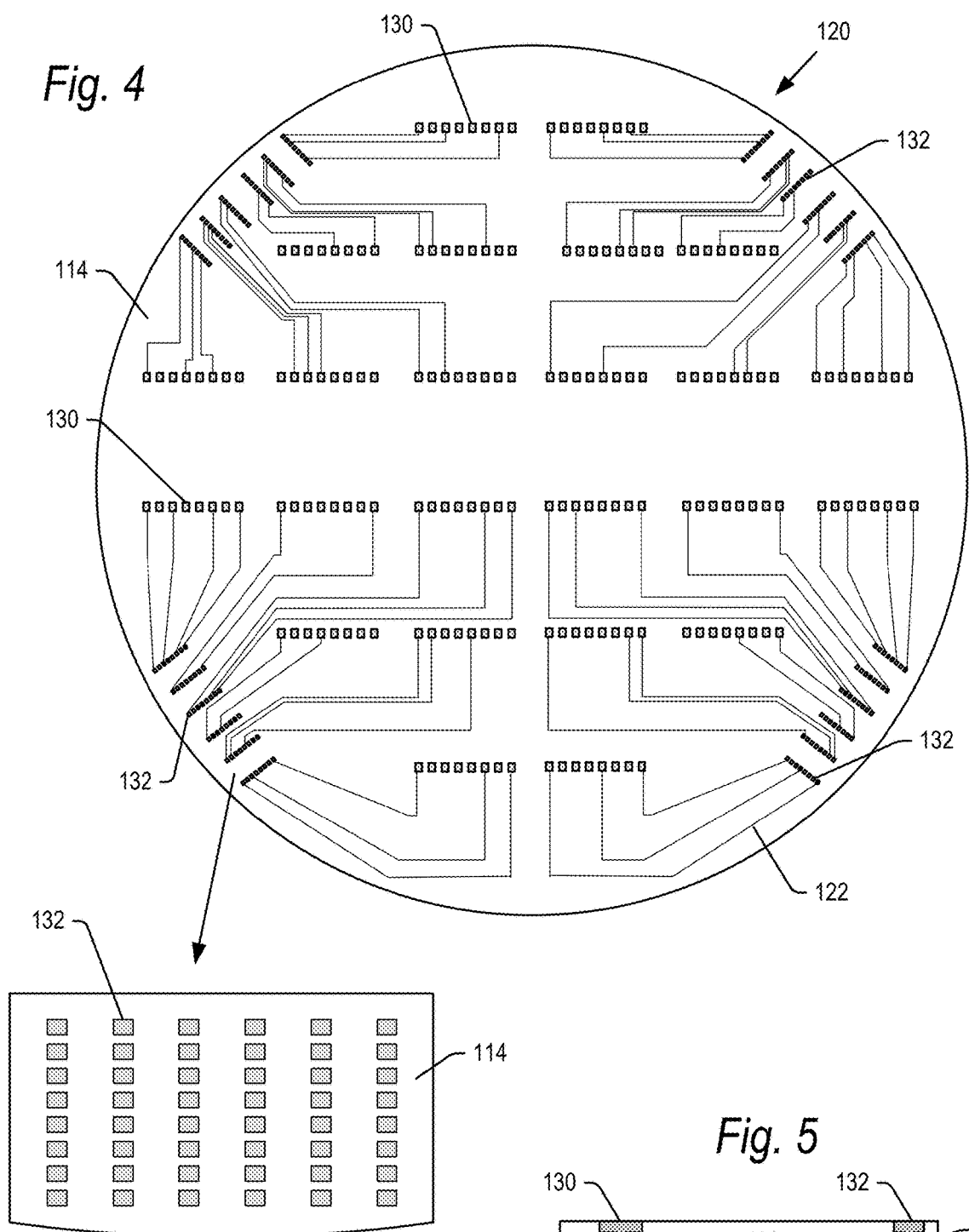
FIG. 4 is a plan view of a second semiconductor wafer, and group of terminals therefrom, according to embodiments of the present technology.
Figure 5:
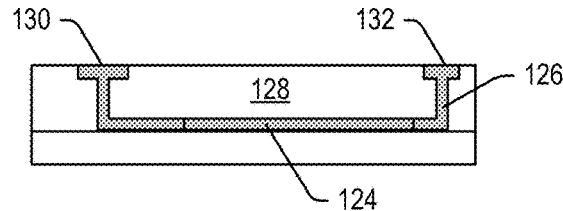
FIG. 5 is a cross-sectional edge view of a portion of the second wafer according to embodiments of the present technology.

Before, after or in parallel with the formation of the semiconductor dies 102 on wafer 100, a second semiconductor wafer 120 may be processed to include electrical interconnects 122 in step 210 as shown in FIGS. 4 and 5. The semiconductor wafer 120 may be cut and polished on both the first major surface 114, and second major surface 116 (FIG. 9) opposite surface 114, to provide smooth surfaces. The electrical interconnects 122 may then be fabricated within the second wafer 120 by forming one or more internal metallization layers 124 and vias 126 within layers of a dielectric film 128, as seen in the cross-sectional view of FIG. 5. The electrical interconnects 122 are shown as being visible on surface 114 in FIG. 4, but they may be buried beneath the surface 114 in further embodiments, as shown in FIG. 5.

As seen for example in FIG. 4, the electrical interconnects 122 extend from interior positions on the wafer 120 out to peripheral positions on the wafer 120. The internal first ends of electrical interconnects 122 correspond to mirror image positions of each of the die bond pads 108 on dies 102 on wafer 100. The peripheral second ends of electrical interconnects 122 correspond to mirror image positions of the cutouts 110 on wafer 100. Only sample electrical interconnects 122 are shown in FIG. 4, and there may be one electrical interconnect 122 on wafer 120 for each die bond pad 108 on wafer 100. There may be more or less electrical interconnects 122 than there are die bond pads 108 in further embodiments. The pattern of electrical interconnects 122 in FIG. 4 is shown by way of example only, and may vary in further embodiments.

The metallization layers 124 and vias 126 may be formed a layer at a time in wafer 120, interspersed with the dielectric film layers 128, using photolithographic and thin-film deposition processes. The photolithographic processes may include for example pattern definition, plasma, chemical or dry etching and polishing. The thin-film deposition processes may include for example sputtering and/or chemical vapor deposition. The metallization layers 124 may be formed of a variety of electrically conductive metals including for example copper and copper alloys, and the vias 126 may be lined and/or filled with a variety of electrically conductive metals including for example tungsten, copper and copper alloys.

Pads are formed at the respective interior and peripheral ends of each of the electrical interconnects 122 in step 208. These pads, referred to herein as terminals 130 and 132, on an electrical interconnect 122 are both formed at first major surface 114. However, the terminal 130 may be formed at the first major surface 114 and the opposed terminal 132 may be formed at the second major surface 116 in a further embodiment described below with respect to FIGS. 16-23.

The terminals 130 are formed on major surface 114 in a pattern mirroring the pattern of die bond pads 108 of each of the dies 102 of the first wafer 100. The terminals 132 are formed on major surface 114 (in the embodiment of FIGS. 4 and 5) in grid patterns corresponding to positions of the cutouts 110 of the first wafer 100. As noted, the electrical interconnects 122 extend between the interior terminals 130 and peripheral terminals 132 to electrically couple each pair of terminals 130 and 132 to each other.

The terminals 130, 132 may be formed for example of copper, aluminum and alloys thereof, and may include a liner on an uppermost surface formed for example of a titanium/titanium nitride stack such as for example Ti/TiN/Ti, though these materials may vary in further embodiments. The terminals and liners may be applied by vapor deposition and/or plating techniques.

After formation of the electrical interconnectors 122 and terminals 130, 132, the second wafer 120 may undergo a backgrind step 216 to thin the wafer 120 to its final thickness. In embodiments, the second wafer may be thinned to a final thickness of 20 μm to 50 μm, such as for example 25 μm, though the final thickness of the second wafer 120 may be greater or lesser than that in further embodiments.

Figure 6:
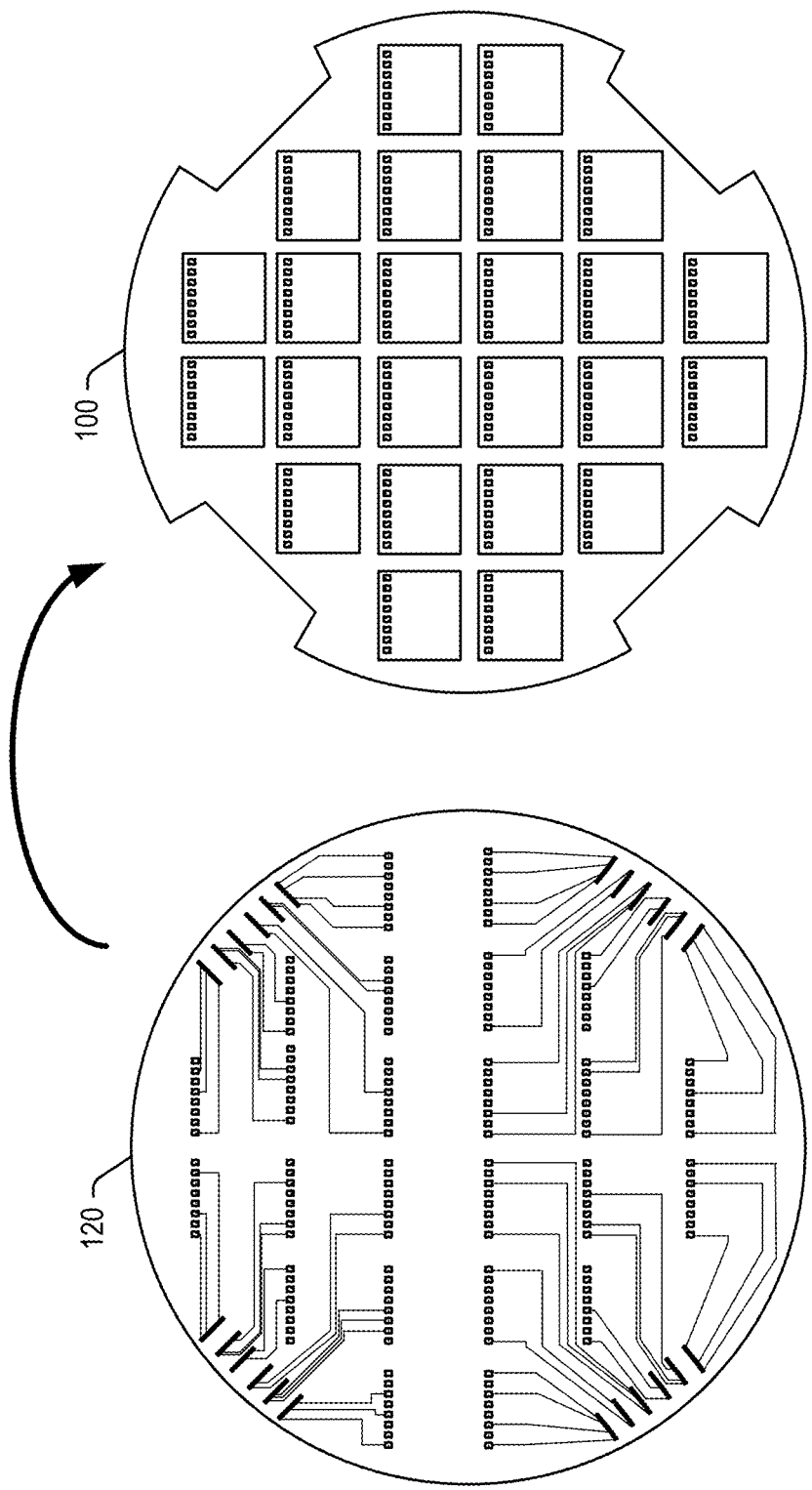
FIG. 6 is a plan view showing the second wafer being flipped over to join with the first wafer according to embodiments of the present technology.
Figure 7:
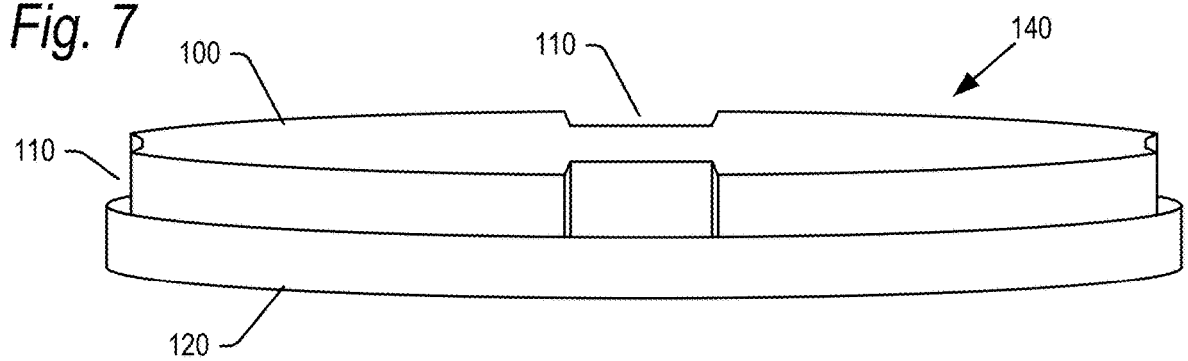
FIG. 7 is a perspective view of an SSD wafer device according to embodiments of the present technology.
Figure 8:
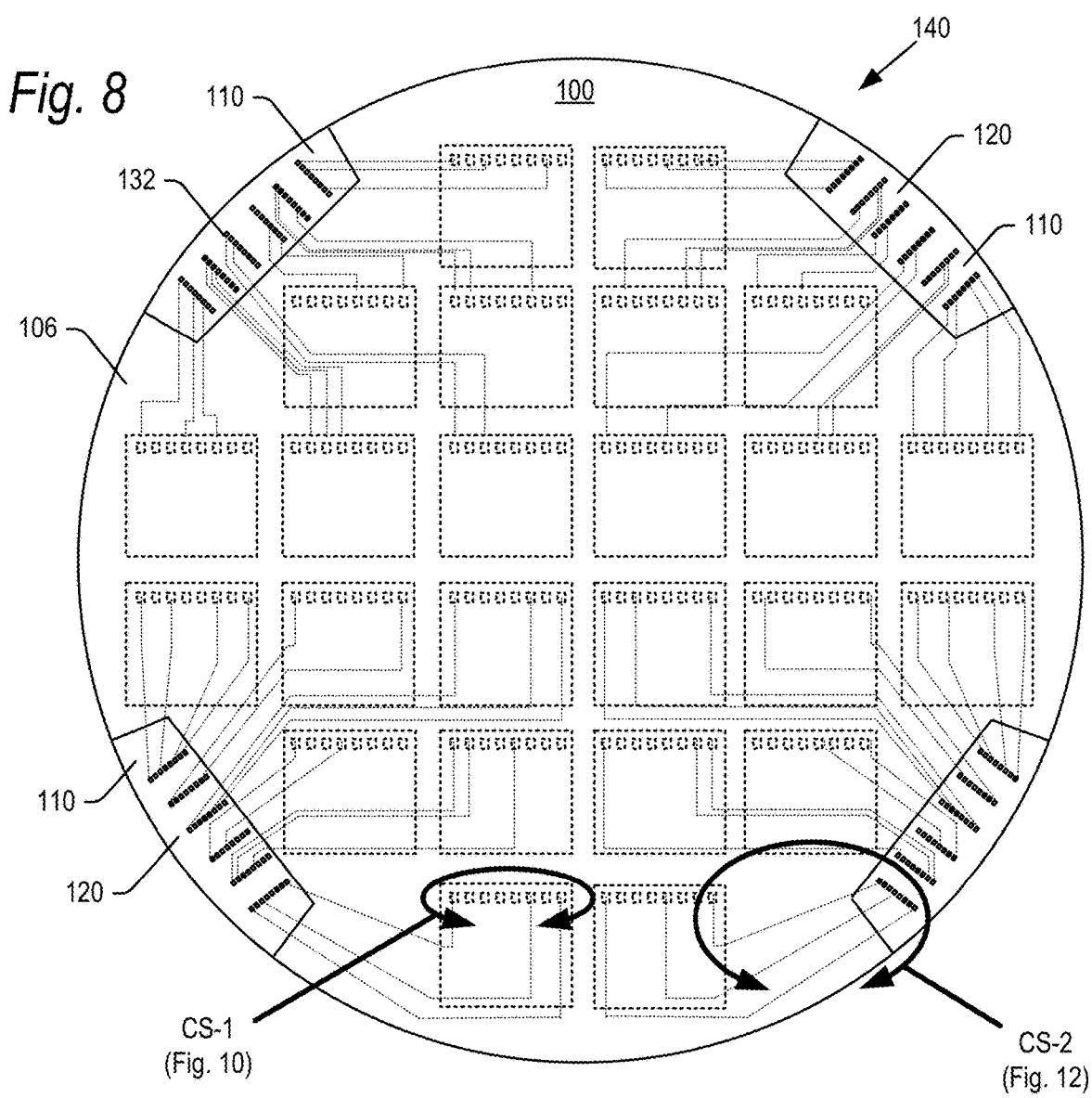
FIG. 8 is a plan view of an SSD wafer device according to embodiments of the present technology.

Once the fabrication of first and second semiconductor wafers 100 and 120 is complete, one of the wafers may be flipped over, such as the wafer 120 as shown in FIG. 6, and the first and second wafers may be affixed to each other in step 220 to form an SSD wafer device 140, as shown in the perspective view of FIG. 7 and the plan view of FIG. 8. The second major surface 106 of wafer 100 is visible in the plan view of FIG. 8, as are the peripheral terminals 132 of the wafer 120 in the cutouts 110. The semiconductor dies 108, terminals 130 and electrical interconnects 122 are shown in phantom lines in FIG. 8, as they are sandwiched together at the interface between surface 104 of wafer 100 and surface 114 of wafer 120. However, the grid patterns of peripheral terminals 132 in wafer 120 are positioned and accessible within the cutouts 110 of wafer 100.

Figure 9:
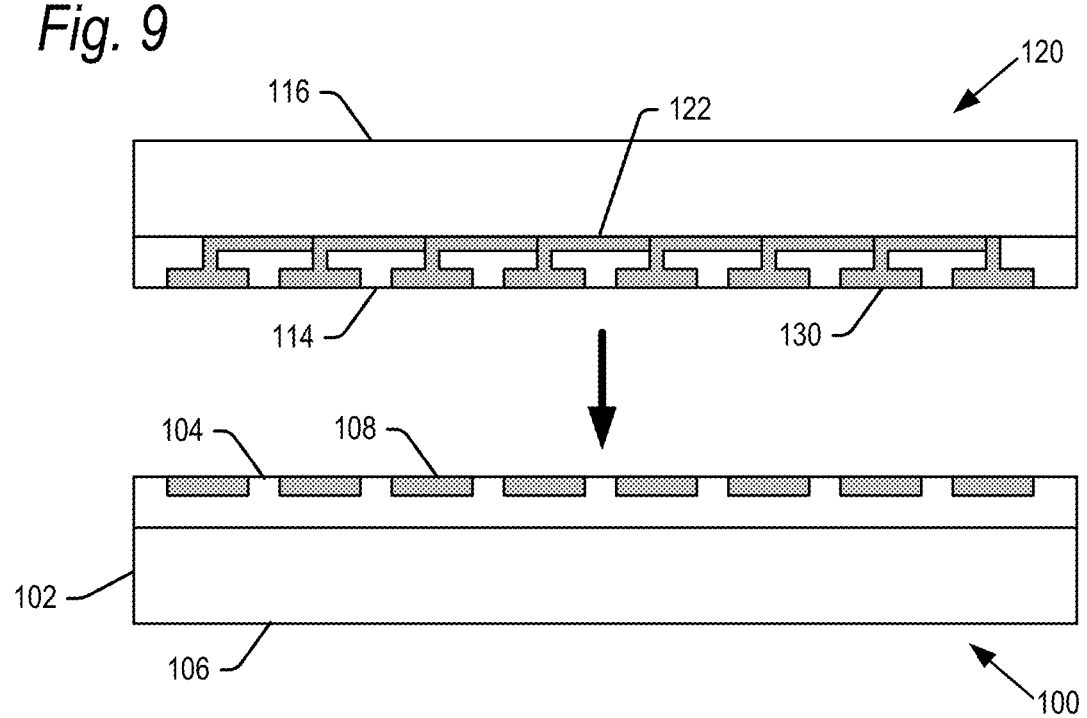
FIG. 9 is a cross-sectional edge view of a first portion of the first and second wafers being joined together according to embodiments of the present technology.
Figure 10:
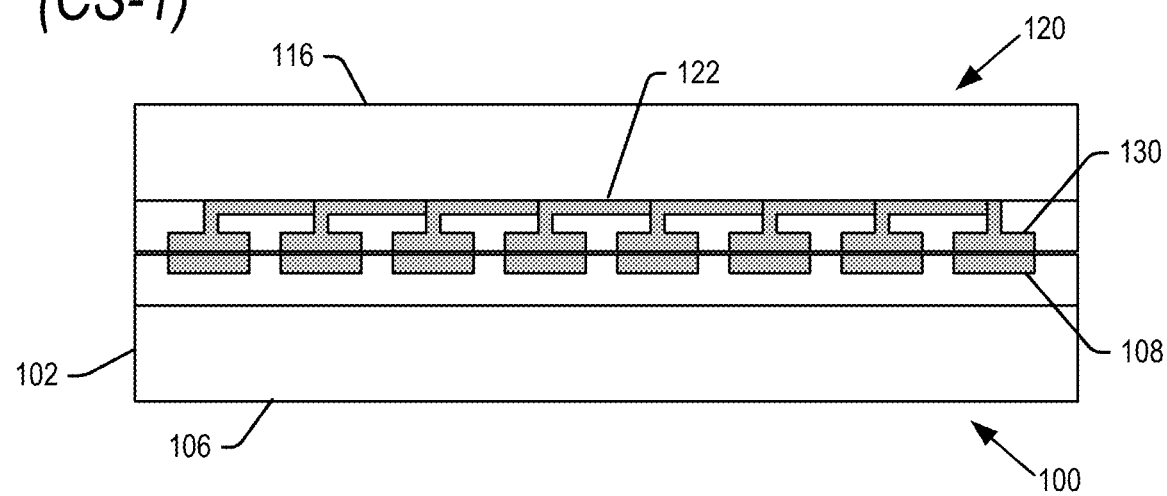
FIG. 10 is a cross-sectional edge view through line CS-1 (FIG. 8) of a first portion of the first and second wafers joined together according to embodiments of the present technology.

FIG. 10 is a cross-sectional view through line CS-1 of FIG. 8. As noted above, the positions of the interior terminals 130 in wafer 120 correspond to the mirror positions of the die bond pads 108 in wafer 100. As shown in FIGS. 9 and 10, when one of the wafers is flipped over and the wafers are brought together, the interior terminals 130 of wafer 120 align with and are bonded to the die bond pads 108 of wafer 100 (FIGS. 9 and 10 show a sample of a single semiconductor die 102).

The terminals 130 and bond pads 108 may be bonded together by any of a variety of bonding techniques, including for example Cu-to-Cu bonding. In a Cu-to-Cu bonding process, the terminals 130 and bond pads 108 are controlled to be planar and formed in a controlled environment largely devoid of ambient particulates that might otherwise settle on a terminal 130 or bond pad 108 and prevent a close bond. Under such properly controlled conditions, the terminals 130 and pads 108 may be aligned and pressed against each other to form a mutual bond based on surface tension. Such bonds may be formed at room temperature, though heat may also be applied. While this process is referred to herein as Cu-to-Cu bonding, this term may also apply even where the terminals 130 and bond pads 108 are formed of materials other than copper.

In a further embodiment, the terminals 130 may be bonded to bond pads 130 by hybrid bonding. In hybrid bonding, a film layer may be provided on wafer 100 and/or wafer 120 around bond pads 108 and/or terminals 130. When the first and second wafers 100, 120 are brought together, the terminals 130 and bond pads 108 may bond together as described above, and the film layer(s) around the terminals 130 and/or pads 108 may further bond the wafers 100, 120 together.

Figure 11:
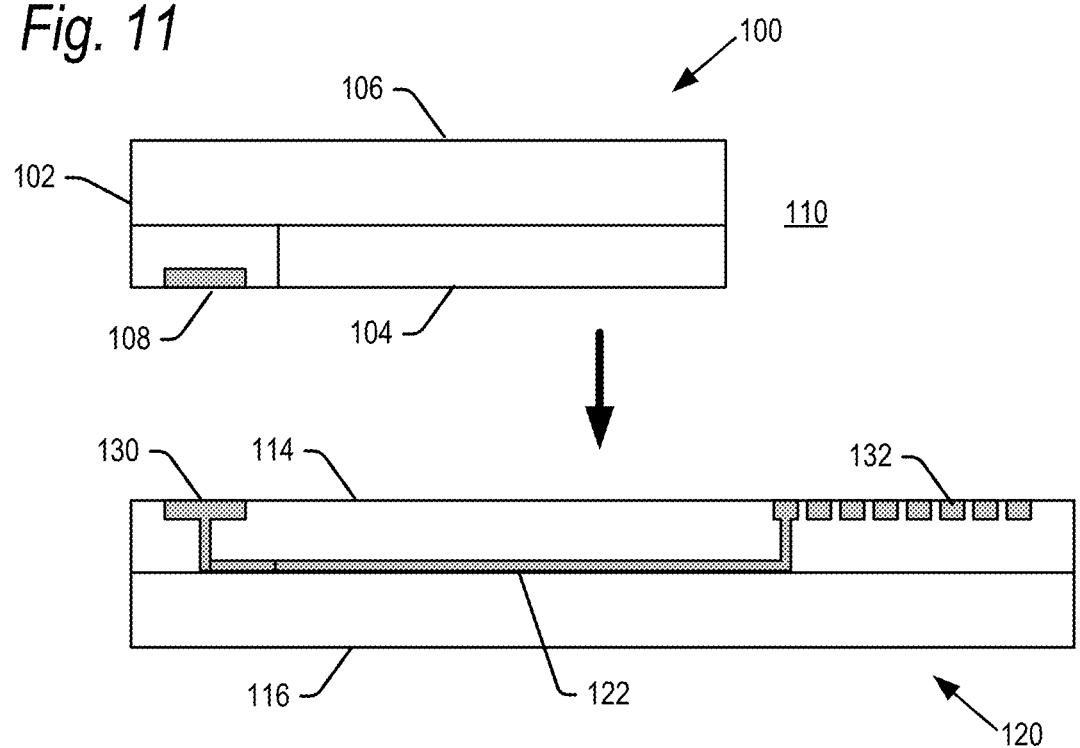
FIG. 11 is a cross-sectional edge view of a second portion of the first and second wafers being joined together according to embodiments of the present technology.
Figure 12:
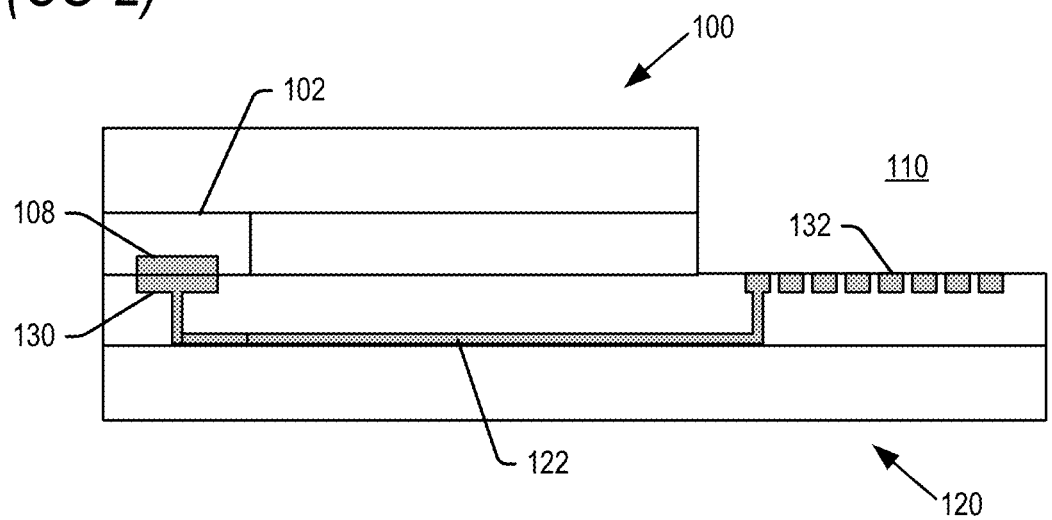
FIG. 12 is a cross-sectional edge view through line CS-2 (FIG. 8) of a second portion of the first and second wafers joined together according to embodiments of the present technology.

FIG. 12 is a cross-sectional view through line CS-2 of 8, showing a portion of one semiconductor die 108 and a cutout 110. As noted above, the positions of the peripheral terminals 132 in wafer 120 correspond to the mirror positions of the cutouts 110 in wafer 100. As shown in FIGS. 11 and 12, when one of the wafers is flipped over and the wafers are brought together, the peripheral terminals 132 of wafer 120 align with and are positioned in the cutouts 110 of wafer 100. FIGS. 11 and 12 show a sample of a single bond pad 108 of a single die 102, connected to a single terminal 130. FIGS. 11 and 12 further show the single electrical interconnect 122 connected to a sample terminal 132 at a cutout 110.

Figure 13:
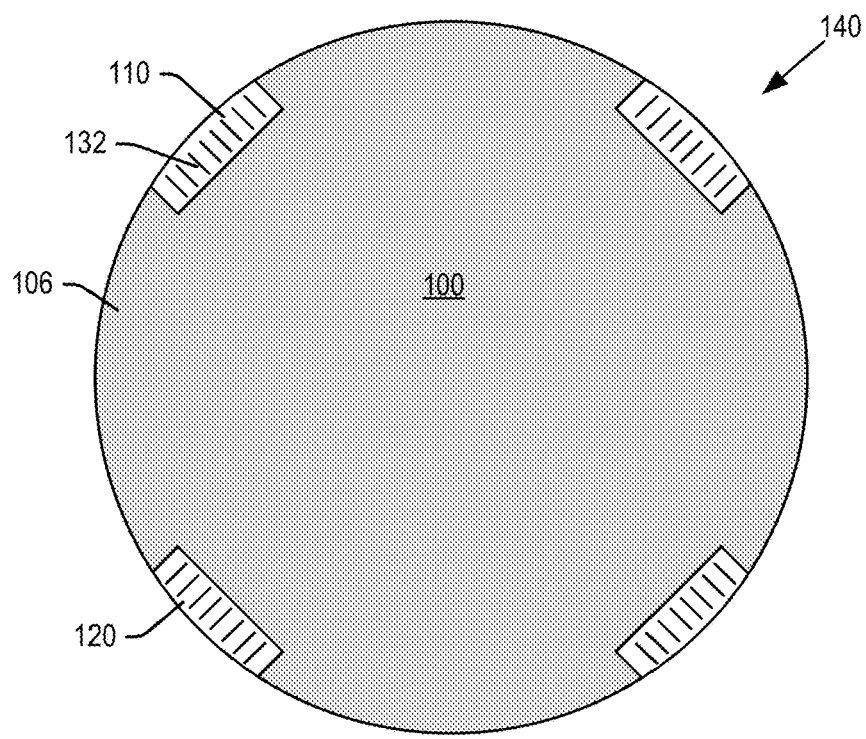
FIG. 13 is a plan view of an SSD wafer device according to embodiments of the present technology.
Figure 14:
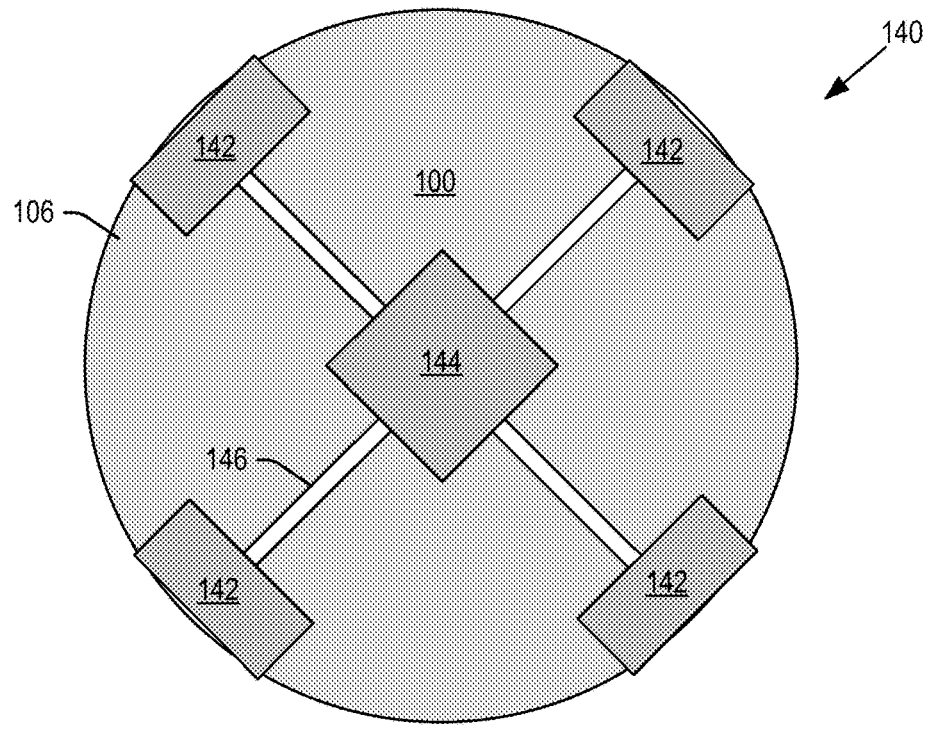
FIG. 14 is a plan view of an SSD wafer device including SSD controllers according to embodiments of the present technology.

FIG. 13 shows a plan view of the SSD wafer device 140 after the wafers 100 and 120 are affixed to each other. From this perspective, the second major surface 106 of wafer 100 is shown, and the grid patterns of terminals 132 in wafer 120 are visible and accessible within cutouts 110. In step 224, SSD controllers 142 and 144 may be affixed to the second major surface 106 of wafer 100 as seen in the plan view of FIG. 14. As seen in FIG. 14 and the cross-sectional view of FIG. 15, the SSD controllers 142 may fit within the cutouts 110 to electrically couple to terminals 132 as by flip-chip bonding. In particular, the SSD controllers 142 may include bond pads 145 that couple to terminals 132 as by Cu-to-Cu bonding. The SSD controllers 142 may be sized to fit within cutouts 110 as shown in FIG. 15, but the SSD controllers 142 may each have a length, width and/or height that are larger or smaller than cutouts 110 in further embodiments.

The respective SSD controllers 142 may in turn be coupled to master SSD controller 144 as by flex circuits 146 affixed between the SSD controllers 142 and master controller 144 on the second major surface 106 of wafer 100. The SSD controllers 142 may be coupled to the master SSD controller 144 by methods other than flex circuits 146.

Once the SSD controllers 142 and 144 are affixed to the SSD wafer device 140, signals and data may be transferred to/from each of the dies 102 on wafer 100 of device 140 through the respective SSD controllers 142. The SSD device 140 may be tested in step 226. Thereafter, signals and data may be transferred between the respective SSD controllers 142 and a host device such as a server through the master SSD controller 144, as explained below in greater detail with respect to FIG. 24. The master SSD controller 144 may include networking capabilities such as an Ethernet network connector to enable communications between the host device and the SSD device 140.

Figure 15:
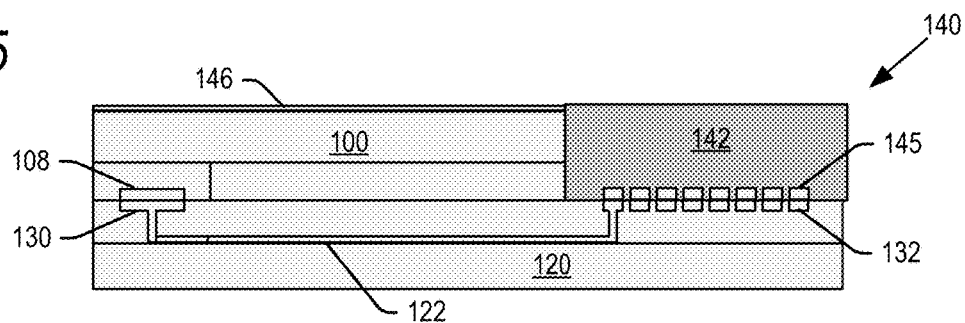
FIG. 15 is a cross-sectional edge view of a portion of the SSD wafer device according to embodiments of the present technology.

In the embodiment of FIGS. 14 and 15, the SSD controllers 142 are examples of data/signal connectors for connecting the terminals 132 of SSD device 140 with the master SSD controller 144. In further embodiments, data/signal connectors other than a controller 142 may electrically couple the terminals 132 of SSD device 140 with the master SSD controller 144. In such embodiments, these data/signal connectors may not perform controller functionality, but may instead simply pass signals and/or data between terminals 132 and master SSD controller 144.

In embodiments described above, the second wafer 120 is fabricated such that the terminals 130 and 132 of electrical interconnects 122 are all on the same major surface 114 of wafer 120, such as shown in the cross-sectional view of FIG. 5. In a further embodiment, the second wafer 120 may fabricated such that the terminals 130 on major surface 114 connect to the terminals 132 on the opposed major surface 116 of wafer 120. Such an embodiment will now be described with reference to FIGS. 16-23.

In the embodiment of FIGS. 16-23, wafer 100 may be fabricated as described above. However, one difference in the embodiment of FIGS. 16-23 is that the cutouts 110 in wafer 100 may be omitted. Wafer 100 in this embodiment may have a circular periphery without the cutouts.

Figure 16:
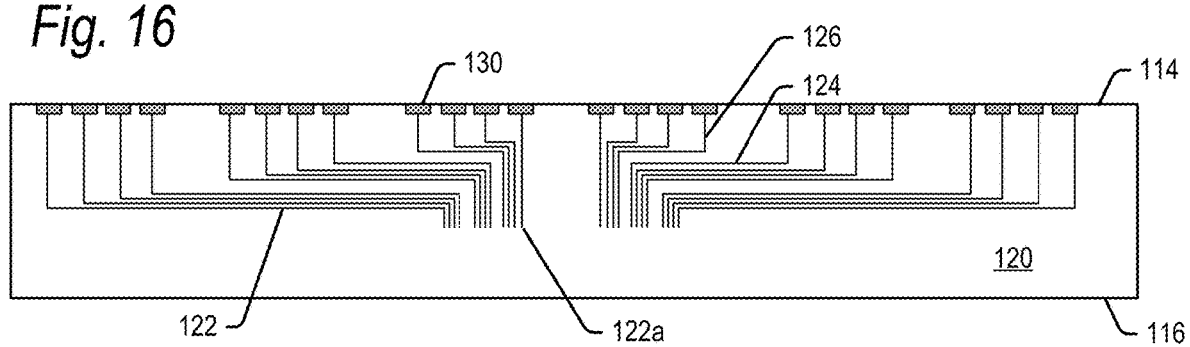
FIGS. 16-18 are cross-sectional edge views of the second semiconductor wafer fabricated according to an alternative embodiment of the present technology.

Referring to the cross-sectional view of FIG. 16, wafer 120 may be fabricated as described above, with the metallization layers 124 and vias 126 forming the electrical interconnects 122. Terminals 130 may then be formed on the first major surface 114 of wafer 120 as described above. FIG. 16 shows a sampling of terminals 130 and electrical interconnects 122. However, the terminals 130 may be provided in a mirror pattern to the die bond pad 108 of the dies 102 in wafer 100 as described above, and each terminal 130 may be connected to an electrical interconnect 122. However, unlike the embodiment described above with respect to FIGS. 2-15, the second ends 122a of the electrical interconnects 122 (opposite the first ends connected to terminals 130) need not extend out to positions corresponding to the above-described cutouts 110. The second ends 122a may cluster together and extend down toward the second major surface 116 of wafer 120.

Figure 17:
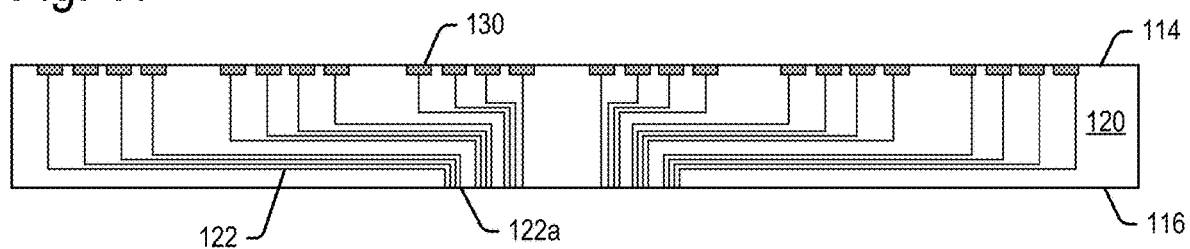
Figure 18:
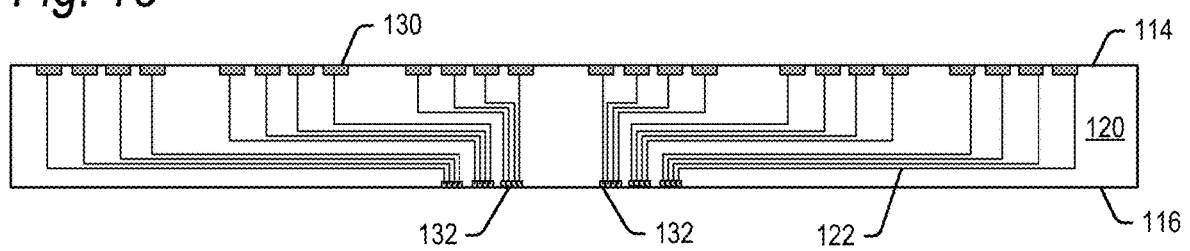
Figure 19:
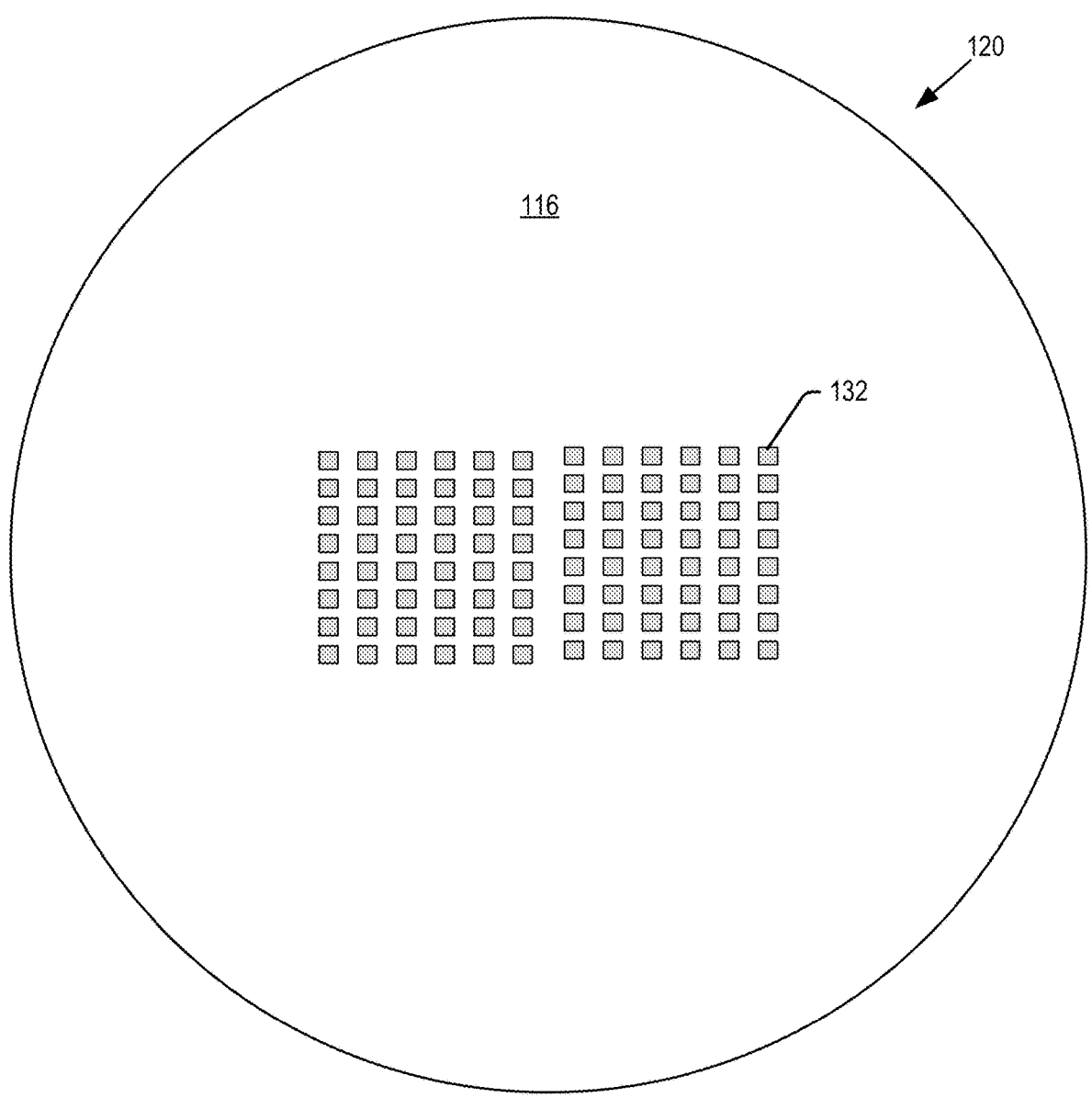
FIG. 19 is a plan view of the second semiconductor wafer fabricated according to the alternative embodiment of the present technology.

Referring to the cross-sectional view of FIG. 17, the wafer 120 may next be thinned in a backgrind step to expose the second ends 122a at the second major surface 116 of wafer 120. Next, wafer 120 may be flipped over and terminals 132 may be formed on the second ends 122a of each electrical interconnect 122, as shown in the cross-sectional view of FIG. 18 and the plan view of FIG. 19. Terminals 132 may be formed on the second major surface 116 as described above. The terminals 132 shown in FIGS. 18 and 19 are by way of example only, and the pattern of the terminals 132 in major surface 116 may vary in further embodiments. Moreover, while the terminals 132 are shown grouped together in a single cluster, there may be multiple clusters of terminals 132 in further embodiments.

Figure 20:
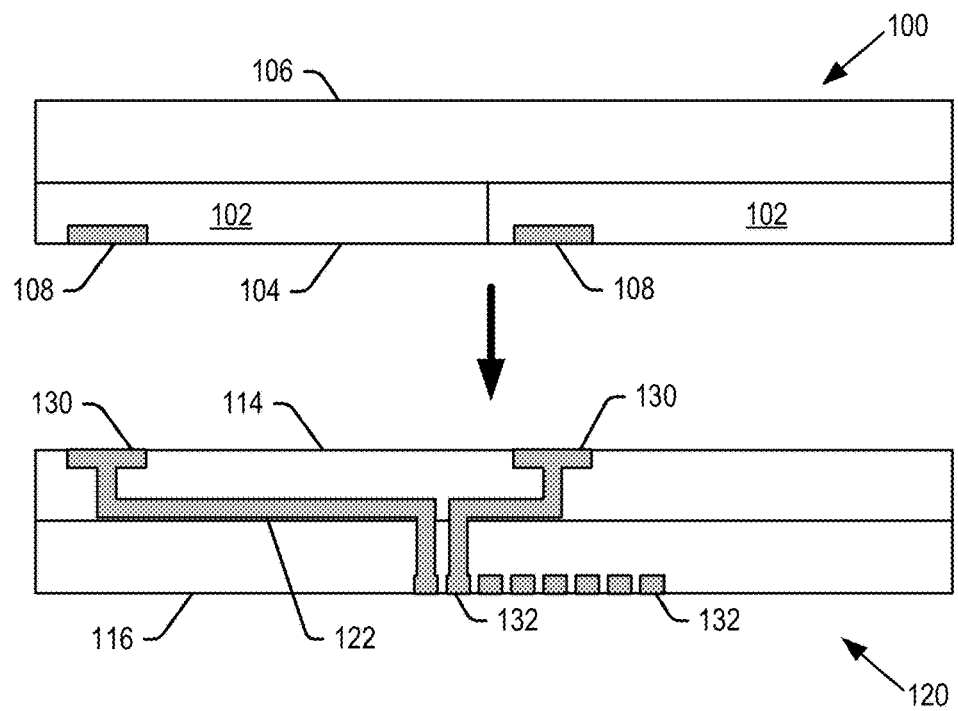
FIG. 20 is a cross-sectional edge view of a portion of the first and second wafers being joined together according to the alternative embodiment of the present technology.
Figure 21:
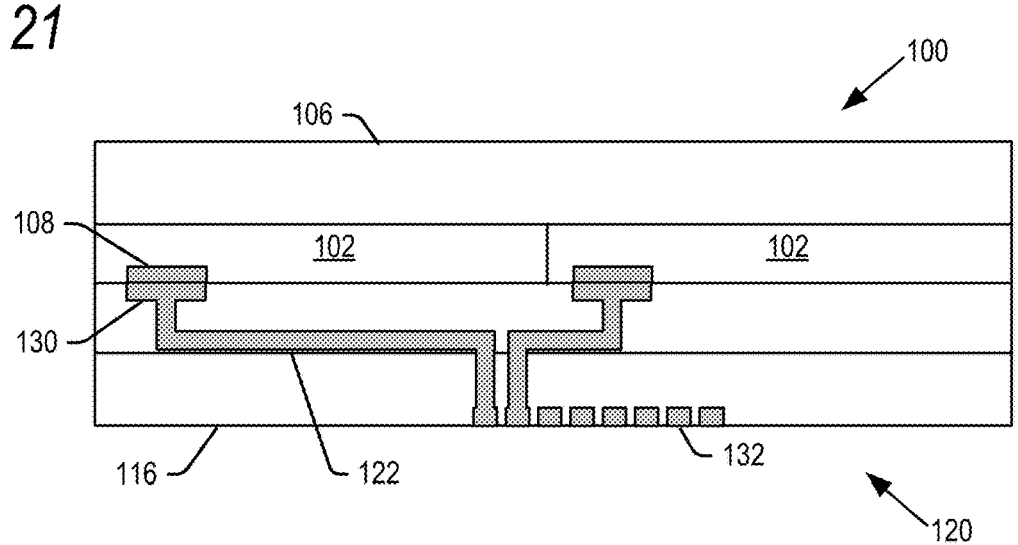
FIG. 21 is a cross-sectional edge view of a portion of the first and second wafers joined together according to the alternative embodiment of the present technology.
Figure 22:
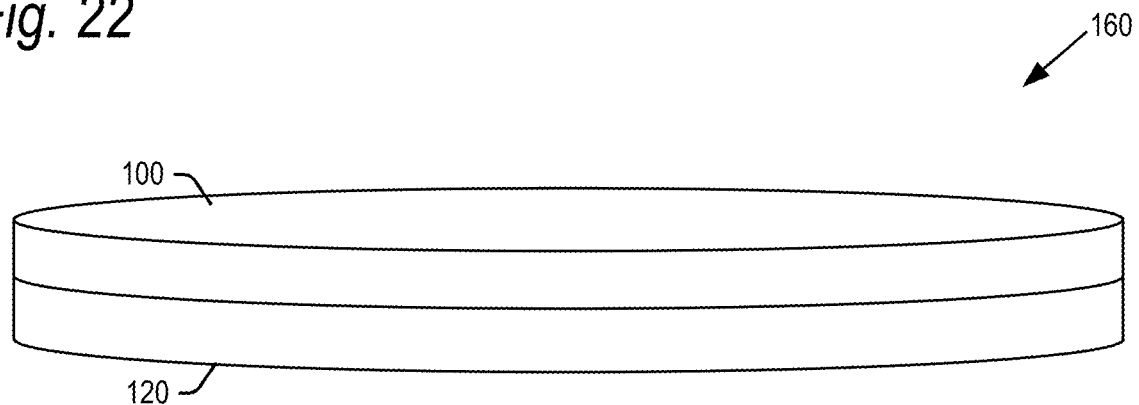
FIG. 22 is a perspective view of an SSD wafer device according to the alternative embodiment of the present technology.

Next, the first major surfaces 104 and 114 of wafers 100 and 120, respectively may be coupled together, for example by Cu-to-Cu bonding as described above. FIGS. 20 and 21 show cross-sectional views of portions of wafers 100 and 120 being joined together. FIG. 22 shows a perspective view of the SSD wafer device 160 formed by joined wafers 100 and 120. As seen in FIGS. 20 and 21, the terminals 130 in wafer 120 may be bonded to each of the die bond pads 108 in wafer 100 as described above. Each of the terminals 130 in the first major surface 114 may be bonded to the terminals 132 in the opposed second major surface 116 by the electrical interconnects 122.

One advantage of terminating the electrical interconnects 122 in the second major surface 116 of wafer 120 is greater flexibility as to the location of the terminals 132 at the second major surface 116. In particular, as the terminals 132 do not need to be positioned at locations corresponding to the cutouts 110, they may terminate anywhere on the second major surface 116. As noted, positions shown in FIG. 19 are only one example, and the terminals 132 may be clustered together at other positions, or spread out into two or more clusters on the second major surface 116.

Figure 23:
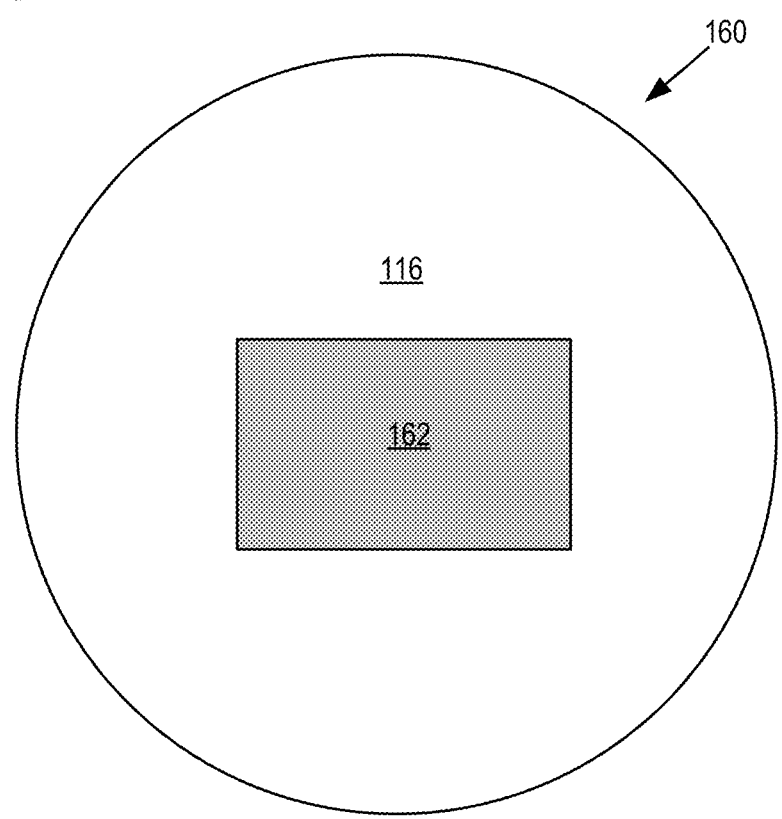
FIG. 23 is a plan view of an SSD wafer device including SSD controllers according to the alternative embodiment of the present technology.

FIG. 23 is a plan view of the SSD wafer device 160 showing an SSD controller 162 affixed to the terminals 132, as for example by flip-chip bonding as described above. SSD controller 162 may control the transfer of signals and data between the SSD wafer device 160 and a host device, such as a server, as explained below with respect to FIG. 24. In this embodiment, where all terminals 132 are clustered together, a single SSD controller 162 may be used. However, where for example there are multiple clusters of terminals 132, multiple SSD controllers may be used, each connected to a master controller as described above.

Figure 24:
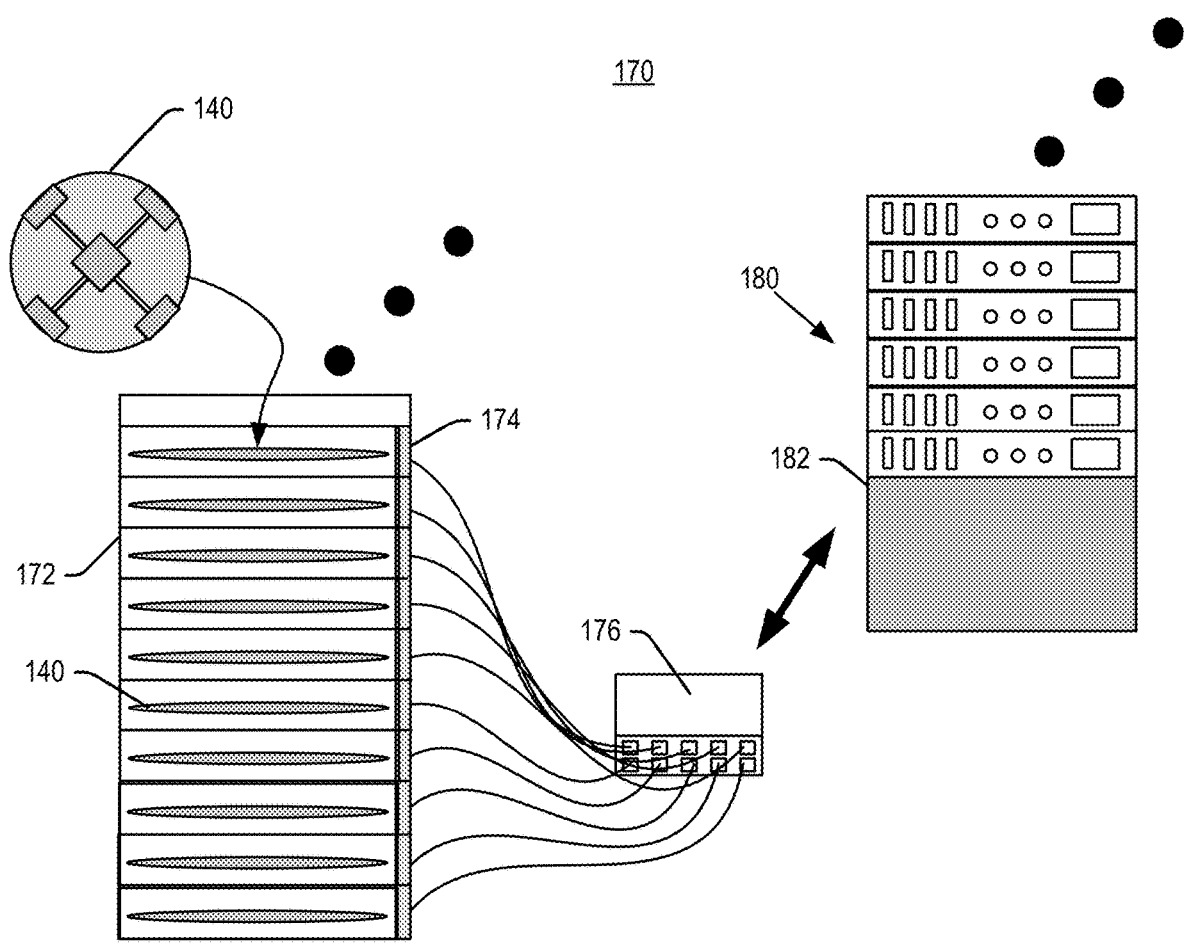
FIG. 24 is a schematic representation of a datacenter operating with the SSD wafer devices according to embodiments of the present technology.

FIG. 24 is a schematic drawing of the SSD wafer devices 140 or 160 used in a datacenter 170. The example shows an SSD wafer device 140, but SSD wafer devices 160 may also or alternatively be used. Multiple wafer devices 140/160 may be housed within a rack 172. While a single rack 172 is shown, there may be multiple such racks 172. Each rack 172 may have a communications interface 174 for transferring signals and data to/from the SSD controllers of each SSD wafer device 140/160 within rack 172. The communications interface may in turn be coupled to a communications hub 176 enabling the transfer of signals and data between the SSD wafer devices 140/160 in rack(s) 172 and host devices 180, which may for example be servers. One or more servers 180 may be housed within a rack 182. While a single rack 182 is shown, there may be multiple racks 182. It is understood that signals and data may be transferred between the SD wafer devices 140/160 and host devices 180 by other communications protocols in further embodiments.

The SSD devices 140 and 160 described above provide several advantages over conventional SSD devices. In conventional devices, individual semiconductor dies are diced from a wafer during wafer fabrication, and then assembled into a semiconductor package including materials such as a substrate, wire bonds and molding compound around the package. As the SSD device of the present technology is fabricated from whole wafers, the step of dicing the wafer into individual semiconductor dies during wafer fabrication may be omitted, and the entire process of assembling the individual dies into a semiconductor package may be skipped, resulting is a significant savings in time, materials and cost. Moreover, the storage capacity of an SSD device 140/160 may be easily scaled by changing the size of the wafers in the SSD device and/or by changing the number of semiconductor dies 102 in the SSD device.

In summary, an example of the present technology relates to a solid state drive (SSD) wafer device, comprising: a first semiconductor wafer comprising first and second major surfaces, and a plurality of memory dies, each memory die of the plurality of memory dies comprising a plurality of bond pads at the first major surface; and a second semiconductor wafer comprising third and fourth major surfaces, and a plurality of electrical interconnects, each electrical interconnect comprising a first terminal, at the third major surface, at a first end of the electrical interconnect, and a second terminal, at one of the third and fourth major surfaces, at a second end of the electrical interconnect opposite the first end; wherein the first major surface of the first semiconductor wafer is coupled to the third major surface of the second semiconductor wafer, with the first terminal of each of the plurality of electrical interconnects bonded to a die bond pad of the plurality of die bond pads.

In another example, the present technology relates to a solid state drive (SSD) wafer device, comprising: a first semiconductor wafer comprising first and second major surfaces, and a plurality of memory dies, each memory die comprising a plurality of bond pads at the first major surface; a second semiconductor wafer bonded to the first semiconductor wafer, the second semiconductor wafer comprising third and fourth major surfaces, and a plurality of electrical interconnects, each electrical interconnect comprising a first terminal, at the third major surface, at a first end of the electrical interconnect, and a second terminal, at one of the third and fourth major surfaces, at a second end of the electrical interconnect opposite the first end, the first terminal of each of the plurality of electrical interconnects bonded to a die bond pad of the plurality of die bond pads; and one or more SSD controllers electrically coupled to the second terminals of the plurality of electrical interconnects In a further example, the present technology relates to a solid state drive (SSD) wafer device, comprising: a first semiconductor wafer comprising first and second major surfaces, and a plurality of NAND dies, each NAND die of the plurality of NAND dies comprising a plurality of bond pads at the first major surface; a second semiconductor wafer coupled to the first semiconductor wafer, the second semiconductor wafer comprising third and fourth major surfaces, and electrical interconnect means comprising a first end at the third major surface and a second end at one of the third and fourth major surfaces; wherein the first and second wafers are bonded together such that the first ends of the electrical interconnect means are electrically coupled to the die bond pads of the plurality of die bond pads.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A solid state drive (SSD) wafer device, comprising:
a first semiconductor wafer comprising first and second major surfaces, a plurality of memory dies, each memory die of the plurality of memory dies comprising a plurality of bond pads at the first major surface, and one or more cutouts; and
a second semiconductor wafer comprising third and fourth major surfaces, and a plurality of electrical interconnects, each electrical interconnect comprising a first terminal at the third major surface, at a first end of the electrical interconnect, and a second terminal at the third major surface, at a second end of the electrical interconnect opposite the first end, the second terminal of each of the electrical interconnects configured to transfer signals between the second semiconductor wafer and an external device;
wherein the first major surface of the first semiconductor wafer is coupled to the third major surface of the second semiconductor wafer, with the first terminal of each of the plurality of electrical interconnects bonded to a die bond pad of the plurality of die bond pads and the second terminal of each of the plurality of electrical interconnects positioned in the one or more cutouts.

2. The SSD wafer device of claim 1, wherein the one or more cutouts comprise a plurality of cutouts are positioned around a periphery of the first semiconductor wafer.

3. The SSD wafer device of claim 1, further comprising one or more SSD controllers electrically coupled to the second terminals of the plurality of electrical interconnects.

4. The SSD wafer device of claim 3, wherein at least one of the one or more SSD controllers is physically positioned within the one or more cutouts.

5. The SSD wafer device of claim 4, wherein the at least one SSD controller is flip-chip bonded to the second terminal of at least some of the plurality of electrical interconnects.

6. The SSD wafer device of claim 1, further comprising:
a plurality of signal/data connectors directly coupled to the second terminals of the plurality of electrical interconnects; and
an SSD controller coupled to the plurality of signal/data connectors to transfer one or both of signals and data to and from the second terminals of the plurality of electrical interconnects.

7. The SSD wafer device of claim 6, wherein the SSD controller comprises a master SSD controller, and the plurality of signal/data connectors comprise SSD controllers coupled to the master SSD controller.

8. A solid state drive (SSD) wafer device, comprising:
a first semiconductor wafer comprising first and second major surfaces, a plurality of memory dies, each memory die comprising a plurality of bond pads at the first major surface, and one or more cutouts;

a second semiconductor wafer bonded to the first semiconductor wafer, the second semiconductor wafer comprising third and fourth major surfaces, and a plurality of electrical interconnects, each electrical interconnect comprising a first terminal at the third major surface, at a first end of the electrical interconnect, and a second terminal at the third major surface, at a second end of the electrical interconnect opposite the first end, the first terminal of each of the plurality of electrical interconnects bonded to a die bond pad of the plurality of die bond pads; and one or more SSD controllers positioned in the one or more cutouts and electrically coupled to the second terminals of the plurality of electrical interconnects.

9. The SSD wafer device of claim 8, wherein at least one SSD controller of the one or more SSD controllers comprises bond pads that are directly coupled to the second terminals of the plurality of electrical interconnects.

10. The SSD wafer device of claim 8, wherein the one or more cutouts comprise at least one cutout at a periphery of the first semiconductor wafer.

11. The SSD wafer device of claim 10, wherein the second terminals of the plurality of electrical interconnects terminate at the third major surface of the second semiconductor wafer at positions corresponding to the at least one cutout when the first and second semiconductor wafer are coupled together.

12. A solid state drive (SSD) wafer device, comprising:
a first semiconductor wafer comprising first and second major surfaces, a plurality of NAND dies, each NAND die of the plurality of NAND dies comprising a plurality of bond pads at the first major surface, and one or more cutouts;

a second semiconductor wafer coupled to the first semiconductor wafer, the second semiconductor wafer comprising third and fourth major surfaces, and electrical interconnect means comprising first ends at the third major surface and second ends at the third major surface;

wherein the first and second wafers are bonded together such that the first ends of the electrical interconnect means are electrically coupled to the die bond pads of the plurality of die bond pads and the second ends of the electrical interconnect means positioned within the one or more cutouts.

* * * * *